United States Patent
Parekh (10) Patent No.: US 6,229,174 B1
(45) Date of Patent: *May 8, 2001

(54) CONTACT STRUCTURE FOR MEMORY DEVICE

(75) Inventor: Kunal R. Parekh, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,897

(22) Filed: Dec. 8, 1997

(51) Int. Cl.[7] .................. H01L 27/108; H01L 29/94
(52) U.S. Cl. .................. 257/306; 257/308; 257/309; 257/310; 257/311; 257/763; 257/764; 438/253; 438/396
(58) Field of Search .................. 257/308, 311, 257/296, 306, 309, 310, 307, 751, 763, 764, 915; 438/253, 254, 396, 397

(56) References Cited

U.S. PATENT DOCUMENTS

| | | | |
|---|---|---|---|
| 5,084,416 | 1/1992 | Ozaki et al. | 437/190 |
| 5,150,276 * | 9/1992 | Gonzalez et al. | 361/313 |
| 5,418,393 | 5/1995 | Hayden | 257/347 |
| 5,451,800 | 9/1995 | Mohammad | 257/191 |
| 5,482,894 * | 1/1996 | Havemann | 438/623 |
| 5,494,841 | 2/1996 | Dennison et al. | 437/52 |
| 5,516,710 | 5/1996 | Boyd et al. | 437/31 |
| 5,550,078 | 8/1996 | Sung | 437/52 |
| 5,552,334 | 9/1996 | Tseng | 437/52 |
| 5,604,365 * | 2/1997 | Kajigaya et al. | 257/306 |
| 5,622,882 | 4/1997 | Yee | 438/210 |
| 5,629,225 | 5/1997 | Iwakiri et al. | 438/397 |
| 5,629,539 * | 5/1997 | Aoki et al. | 257/306 |
| 5,631,184 | 5/1997 | Ikemasu et al. | 438/397 |
| 5,631,185 | 5/1997 | Kim et al. | 438/397 |
| 5,652,164 | 7/1997 | Dennison et al. | 437/52 |
| 5,702,990 | 12/1997 | Jost et al. | 438/618 |

* cited by examiner

Primary Examiner—Leo P. Picard
Assistant Examiner—Hung Van Duong
(74) Attorney, Agent, or Firm—Workman, Nydegger & Seeley (57) ABSTRACT

Disclosed is a method of forming a self-aligned contact to a semiconductor substrate by use of a sacrificial spacer. The sacrificial spacer has the advantage of self aligning metallization to the semiconductive substrate or to a polysilicon plug material without extra photolithography steps as are required in the prior art.

17 Claims, 8 Drawing Sheets

CONTACT STRUCTURE FOR MEMORY DEVICE

BACKGROUND OF THE INVENTION

1. The Field of the Invention

The present invention relates to the formation of a depression in a semiconductor structure. More particularly, the present invention relates to a method of forming a sacrificial plug in a semiconductor structure during a damascene process. In particular, the present invention relates to a method of forming a sacrificial nitride spacer as part of the formation of a contact to a polysilicon plug that makes contact to a semiconductive substrate. The inventive method of forming the sacrificial spacer also provides an advantage of being self-aligned to the underlying polysilicon plug that is to be contacted.

2. The Relevant Technology

In the microelectronics industry, a substrate refers to one or more semiconductor layers or structures which include active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the fabrication of semiconductor devices, metal contacts are formed over semiconductor substrates that have been processed to form devices connected to each other to form integrated circuits. In particular, the devices are connected with aluminum and aluminum alloys lines that have been deposited into vias and other recesses such as trenches and contact corridors. This method is used generally in the industry. However, as devices have been miniaturized, due to a higher device density on a semiconductor substrate and a smaller device, the openings to be filled have smaller cross-sectional "footprints".

Typically, contacts have cross-sectional footprints of about 0.35 microns or smaller. The alignment of a composite contact with a footprint of about 0.35 microns is problematic, and fabrication yield with such a process prerequisite may be unacceptably low due to misalignment. In addition to the problem of sub-micron misalignment of a composite contact, an increased resistivity is caused due to a physical seam between two discrete sections of the contact.

While the aluminum in the contact and an active area in a semiconductor substrate must be electrically connected, it has become useful to use intermediate layers to provide better electrical connection to the semiconductive substrate, and to provide a metallurgical barrier between the active area and the aluminum to prevent spiking of the aluminum into the active area. Spiking can interfere with the performance and reliability of the integrated circuit.

Figure 1:
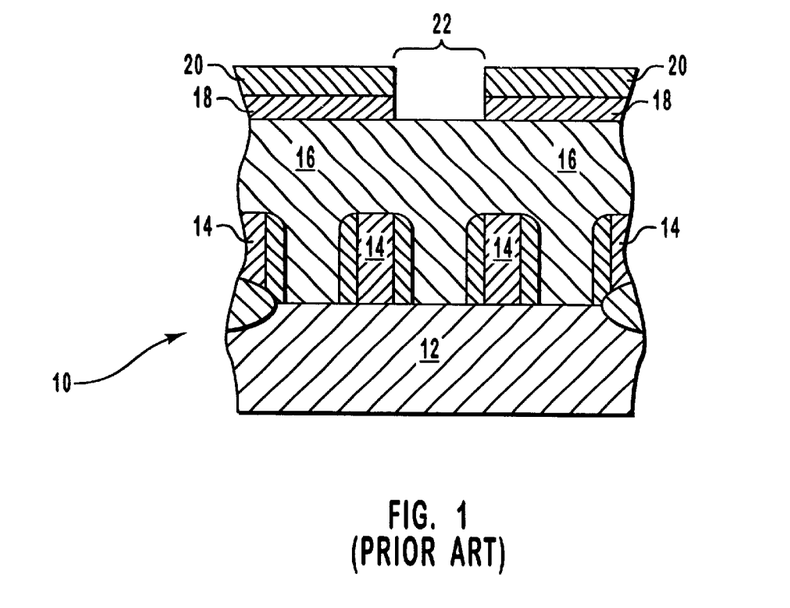
FIG. 1 is an elevational cross-section view of a semiconductor structure wherein a patterned masking layer has been used to form a recess in an interlayer dielectric that has been aligned in such a manner so as to substantially bisect a region between two gate stacks that rest upon a semiconductive substrate.

Conventionally, one method which has been used to accomplish the metallurgical barrier has been to form a layer of titanium over a semiconductor substrate at the interconnect-exposed site, to form a titanium silicide barrier layer at the exposed site, and in the presence of nitrogen, to form a titanium silicide/titanium nitride composite layer substantially from the titanium layer. Another solution has been to form the titanium silicide barrier layer first and then to sputter additional titanium nitride over the titanium silicide or titanium silicide/titanium nitride layer. In this way, a sufficient thickness of titanium nitride may be formed to provide a desired thickness in the metallurgical barrier. Typically, in order to form a composite contact consisting of, for example, a metallization trench above a polysilicon plug that contacts a semiconductive substrate or a metallization trench that contacts the polysilicon plug, two photolithography steps are carried out. FIG. 1 illustrates a first step in the two-step photolithography process, wherein a semiconductor structure 10 includes a semiconductive substrate 12 with raised structures thereon such as a gate stack 14. Gate stack 14 may be covered with a dielectric layer 16 such as an oxide, for example, boro phospho silicate glass (BPSG) and the like. Typically, but not necessarily, an interlayer dielectric (ILD) 18 may be formed upon dielectric layer 16.

A first aspect of forming a contact to semiconductive substrate 12 is carried out by patterning a first masking layer 20 and carrying out an anisotropic etch such as to form a first recess 22 through interlayer dielectric 18. Where interlayer dielectric 18 is not present, first recess 22 forms to a limited depth within dielectric layer 16 but first recess 22 does not penetrate substantially to expose semiconductive substrate 12. First masking layer 20 is then removed.

Figure 2:
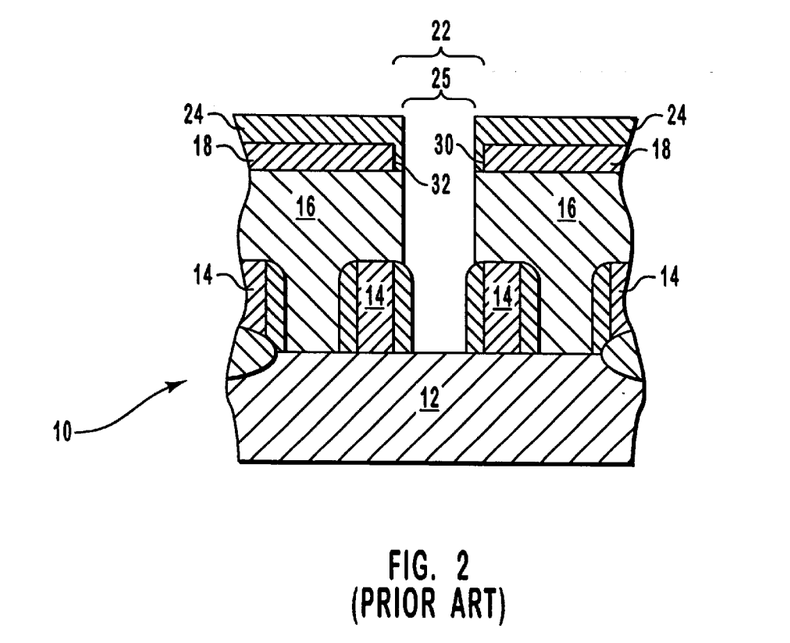
FIG. 2 is an elevational cross-section view of the semiconductor structure depicted in FIG. 1, wherein a second masking layer has been patterned to be substantially aligned with the recess formed in FIG. 1, and wherein an etching process has been carried out to form a second recess that substantially penetrates dielectric layers and exposes the semiconductive substrate.

Following formation of first recess 22, a second masking layer 24 seen in FIG. 2 is formed upon semiconductor structure 10 and patterned to be substantially aligned with first recess 22 in preparation for a second etch. This second etch is an aspect of a dual-damascene etch process that is used to form a contact corridor. The second etch is carried out to sufficiently penetrate through dielectric layer 16 and to stop on semiconductive substrate 12 so as to form a second recess 25. The dual-damascene feature can be seen in FIG. 2 wherein interlayer dielectric 18 has an ILD sidewall 30 and dielectric layer 16 has a dielectric layer sidewall 32.

Forming a dual-damascene structure for a contact according to the prior art includes the problem of a dual or single misalignment during patterning of either first masking layer 20 or second masking layer 24. Where patterning of either first masking layer 20 or second masking layer 24 is misaligned, etching of either first recess 22 or second recess 26 may cause destructive etching into gate stack 14. Etching into gate stack 14, followed by filling with an electrically-conductive material will likely cause shorting between the electrically conductive material and the electrically conductive portion of gate stack 14. Where first recess 22 may be misaligned, formation of second recess 25 may require penetration both through dielectric layer 16 but also through interlayer dielectric 18 such that the total effect of etching may not penetrate dielectric layer 16 sufficiently to expose semiconductive substrate 12 to a "footprint" area sufficient for a functioning contact. Where semiconductive substrate 12 is not exposed, an inadequate contact may be formed within second recess 25.

Another example of forming a composite contact includes forming a first recess that is substantially above a polysilicon plug. Forming a contact hole within the recess exposes an upper surface of the polysilicon plug. Formation of first recess 22 is done through interlayer dielectric 18 when used in a process to form a composite contact. The composite contact formation process includes a polysilicon plug (not shown) and forming first recess 22 to a limited depth within dielectric layer 16. However, first recess 22 does not penetrate substantially to expose the polysilicon plug.

FIGS. 3–6 illustrate a prior art process of forming a dual-damascene contact structure to a polysilicon plug, and that also show some of the disadvantages of prior art. In FIG.

Figure 3:
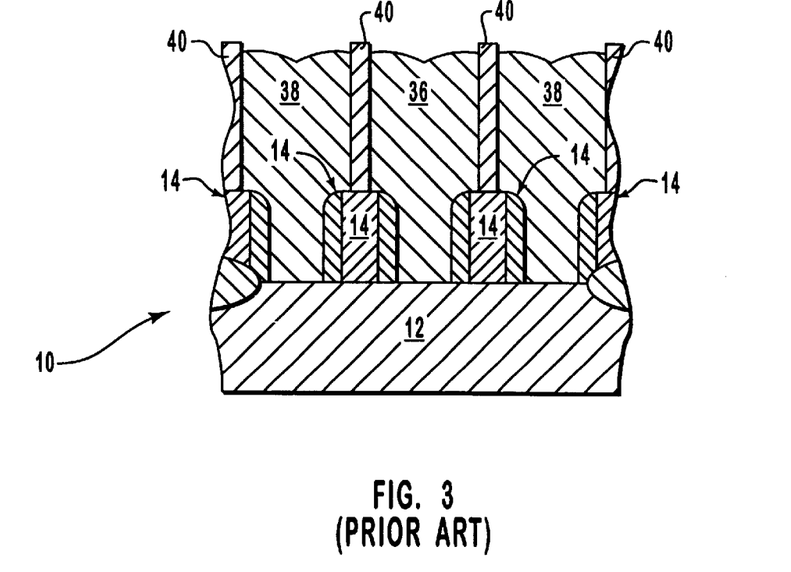
FIG. 3 is an elevational cross-section view of a semiconductor structure made by prior art methods wherein both the contact structure in the middle and the peripheral structure are made of the same polysilicon material or the like, and wherein the dual-damascene process of the prior art is used to complete a contact hole and a trench above the contact plug.

3, semiconductor structure 10 has been processed to form a contact plug 36 and a storage node 38 by a uniform etchback of a polysilicon film that has been deposited over and around sacrificial spacers 40.

Figure 4:
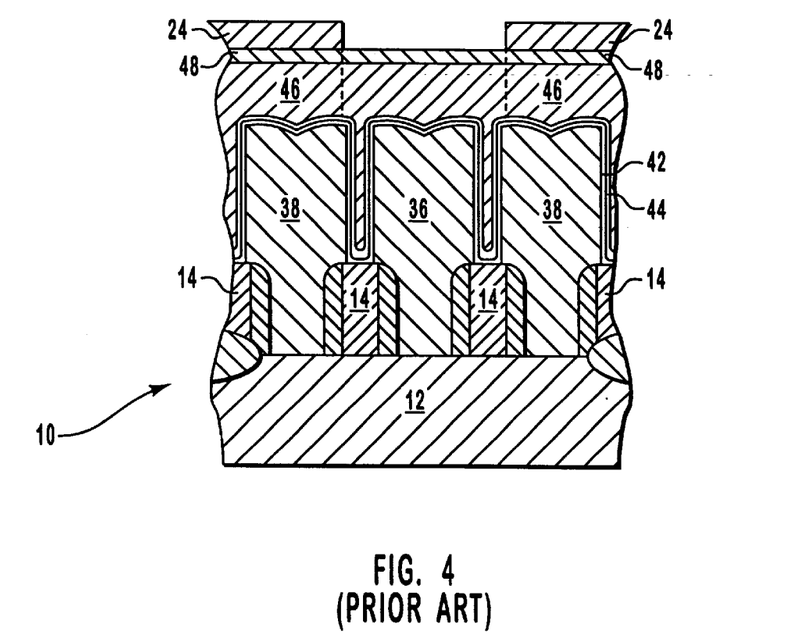
FIG. 4 is an elevational cross-section view of the semiconductor structure depicted in FIG. 3 after further processing, wherein a cell dielectric layer and a cell plate layer are deposited, a dielectric film is deposited, an optional nitride layer is deposited, and a masking layer is patterned in which the effect of planned etching is illustrated as being centered on the contact structure in the middle.

In FIG. 4, further processing has been carried out, wherein a cell dielectric 42 and a cell plate layer 44 have been substantially conformably deposited upon storage node 38 and contact plug 36. It can also be seen that a dielectric film 46, an optional nitride layer 48, and second masking layer 24 have been formed upon semiconductor structure 10, whereby second masking layer 24 indicates with dashed lines an etch footprint that will be formed during an etch to remove portions of dielectric film 46, cell dielectric 42, and cell plate layer 44 that are disposed upon contact plug 36.

Figure 5:
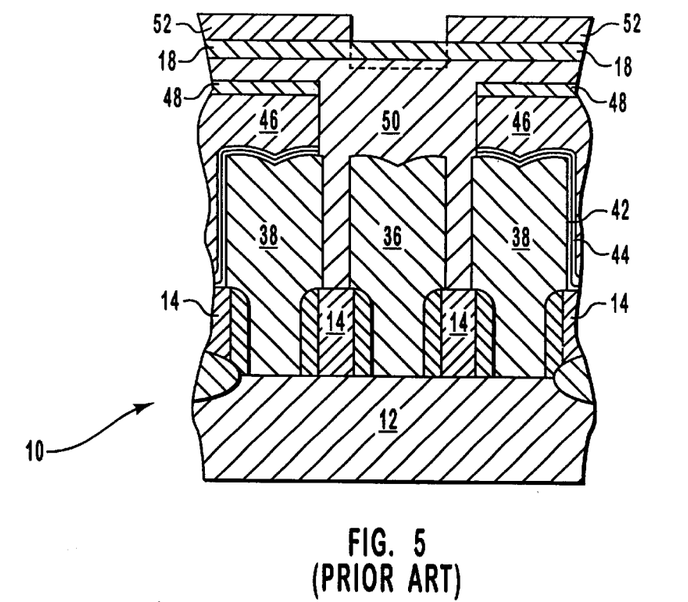
FIG. 5 is an elevational cross-section view of the semiconductor structure depicted in FIG. 4 after further processing, wherein following etching that substantially electrically isolates the contact structure in the middle from the peripheral structure, a dielectric film is deposited and optionally reflowed, an optional nitride layer is deposited, and a masking layer is patterned in preparation for forming a first depression that may be filled with metallization such as trench wiring.

In FIG. 5, the effect of an etch to remove portions of dielectric film 46, cell dielectric 42, and cell plate layer 44 is illustrated. It can also be seen that a second dielectric film 50 has been deposited and optionally reflowed to substantially fill regions between contact plug 36 and storage node 38. It can also be seen that a third masking layer 52 has been patterned to indicate with dashed lines an etching footprint that is designed to be formed within interlayer dielectric 18 that may eventually form a recess such as a metallization wiring trench and the like.

Figure 6:
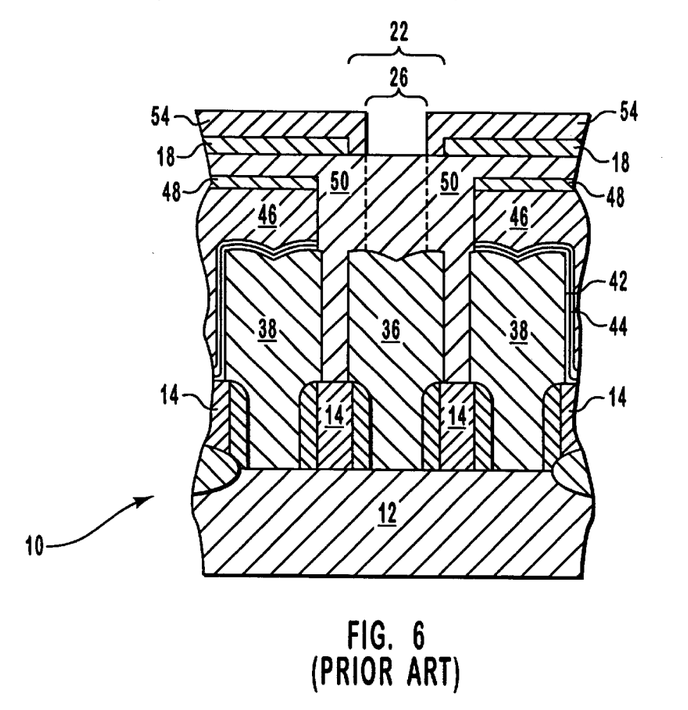
FIG. 6 is an elevational cross-section view of the semiconductor structure depicted in FIG. 5 after further processing, wherein a first recess has been formed in the optional nitride layer, wherein a second masking layer has been patterned to substantially be aligned with the contact structure in the middle, thus forming a dual-damascene contact structure.

In FIG. 6, it can be seen that a dual-damascene structure is being formed wherein a fourth masking layer 54 has been patterned to expose and indicate with dashed lines what will be an etching footprint that will form a contact hole to substantially expose contact plug 36, and wherein the contact hole will be substantially within first recess 22.

As illustrated in FIGS. 3–6, it can be seen that at least four separate alignment and etching processes must be carried out in order to achieve contact to contact plug 36, wherein both a wiring trench and a contact hole are formed. In any one of the alignment and etch processes, the possibility of misalignment, and therefore process error increases.

What is needed in the art is a method of forming a contact to a semiconductive substrate that avoids the problems of the prior art. What is also needed is a method of forming a contact to a polysilicon plug that contacts a semiconductive substrate without the problems of misalignment. What is particularly needed in the art is a method of forming a dual-damascene, self-aligned contact that is aligned with a polysilicon plug, where the method protects the polysilicon plug from any etching that may be required to expose but not overexpose the polysilicon plug.

SUMMARY OF THE INVENTION

The present invention relates to a method of forming a contact for a metal-filled dual damascene process by use of a sacrificial plug.

One embodiment of the present invention includes formation of a contact to a polysilicon plug. A semiconductor structure includes a semiconductive substrate, a gate stack, and a sacrificial spacer. The sacrificial spacer may include a first BPSG layer or the like, an etch stop layer, and a second BPSG layer or the like.

The sacrificial spacer is patterned and etched and an electrically-conductive film is substantially conformally deposited over exposed portions of the semiconductive substrate, gate stack, and sacrificial spacer.

Planarization of the electrically-conductive film may or may not be required, depending upon the capability of the electrically-conductive film to substantially fill onto the semiconductor structure both around and above the sacrificial spacer in a manner that does not substantially reveal the topology thereof.

Following the formation of the electrically-conductive film, a nitride layer is formed that will eventually form the sacrificial plug structure of the inventive method. A first masking layer is formed in a manner that will protect the nitride layer above that portion of the electrically-conductive film that will become the polysilicon plug.

An anisotropic dry etch is preferably used to remove all exposed portions of the nitride layer and subsequently exposed portions of the electrically-conductive film to a preferred height below the upper prominence of the sacrificial spacer. In this manner, out of the electrically-conductive film, a storage node is formed peripheral to the polysilicon plug. The polysilicon plug stands higher than the storage node, and the polysilicon plug is capped by the remnant of the first nitride layer that has been formed into a nitride island due to the dry etch. The silicon nitride island forms the sacrificial spacer.

Following formation of the nitride island and of the anisotropic dry etch that results in the storage node and polysilicon plug, a subsequent etch is carried out to substantially remove the sacrificial spacer. Where the storage node forms part of a memory cell, a cell dielectric and a cell plate layer are deposited over the semiconductor structure.

A second photoresist is patterned in a manner to substantially expose the nitride island and the sidewall of the polysilicon plug. An etch is carried out to clear cell dielectric and cell plate material from the polysilicon plug. A rich BPSG chemistry is deposited upon the exposed topology of the semiconductor structure.

In this embodiment, the polysilicon plug stands higher than the storage node. Depending upon the overall height of the dielectric layer above the polysilicon plug, an interlayer dielectric may be formed to enhance the overall height. Removal of the silicon nitride island is next carried out to form a recess, preferably with a wet etch that is selective to polysilicon and BPSG according to the sacrificial plug nature of the present invention.

A metallization layer is formed upon the semiconductor structure particularly within the recess that is created after removal of the silicon nitride island. After force filling of the metallization layer into the recess, an upper surface of the interlayer dielectric is formed that is substantially co-planar with portions of the metallization layer. That portion of the metallization layer that is within the recess may comprise a filled contact hole, a filled contact hole and trench, or a filled trench that contacts a polysilicon contact plug.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a method of forming a contact for a metal-fill dual damascene process by use of a sacrificial plug. Reference will now be made to the drawings wherein like structures will be provided with like reference designations. It is to be understood that the drawings are diagrammatic and schematic representations of an embodiment of the present invention are not drawn to scale.

Figure 7:
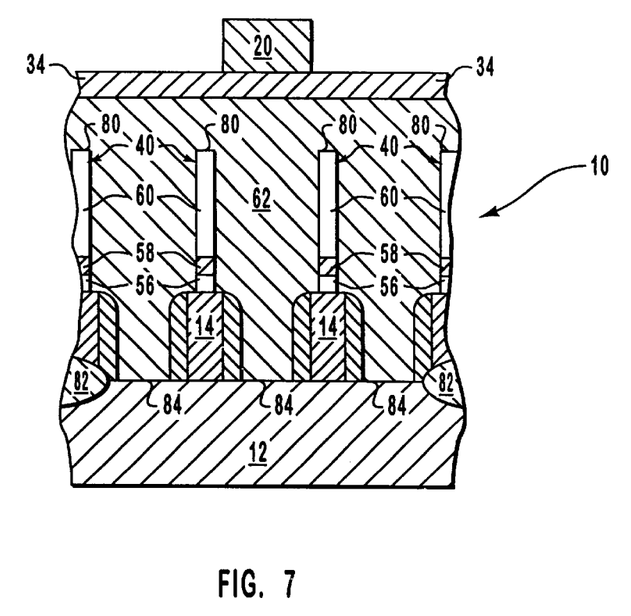
FIG. 7 is an elevational cross-section view of a semiconductor structure according to a first general aspect of the present invention, wherein a conductive material such as a polysilicon layer has been deposited over a preferred topology that rests upon a semiconductive substrate, wherein a dielectric layer has been formed upon the polysilicon layer, and wherein a masking layer has been patterned to form a masking island above the polysilicon structure in the middle that contacts the semiconductive substrate.

One embodiment of the present invention includes formation of a contact to a polysilicon plug that may be illustrated by way of non-limiting example by reference to FIG. 7. In FIG. 7 is can be seen that semiconductor structure 10 includes semiconductive substrate 12, gate stacks 14, and sacrificial spacers 40. Each sacrificial spacer 40, may include, by way of non-limiting example, a first BPSG layer 56 or the like, an etch stop layer 58 that may be by way of non-limiting example, an oxide formed by the method of decomposition of tetra ethyl ortho silicate (TEOS), and a second BPSG layer 60 or the like.

As can be seen in FIG. 7, each sacrificial spacer 40 has been patterned and etched and an electrically-conductive film 62, that may be, by way of non-limiting example, a doped polysilicon material, has been substantially conformably deposited over exposed portions of semiconductive substrate 12, gate stacks 14, and sacrificial spacers 40.

Planarization of electrically-conductive film 62 may or may not be required, depending upon the capability of electrically-conductive film 62 to substantially conformably flow upon semiconductor structure 10 and around and above sacrificial spacers 40 in a manner that does not substantially reveal the topology thereof.

Following the formation of electrically-conductive film 62, a nitride layer 34 is formed that will eventually form the sacrificial plug structure of the inventive method. In FIG. 7, it can be seen that a first masking layer 20 has been formed after a manner that will protect nitride layer 34 above that portion of electrically-conductive film 62 that will become the contact structure in the middle.

Figure 8:
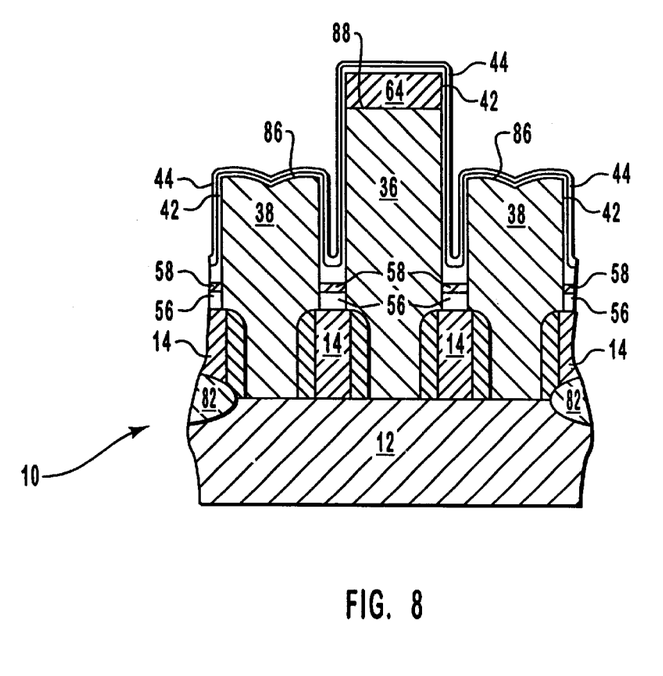
FIG. 8 is an elevational cross-section view of the semiconductor structure after further processing, wherein etching of the dielectric layer has formed a dielectric island above the polysilicon structure in the middle, wherein the same or a different etching has reduced the height of the conductive material that is the peripheral polysilicon structure that stands on either side of the polysilicon structure in the middle, wherein a capacitor cell dielectric layer has been formed, and wherein a capacitor plate layer has been formed.

FIG. 8 illustrates further processing of semiconductor structure 10 according to the method of the present invention. An anisotropic dry etch is preferably used to remove all exposed portions of nitride layer 34 and subsequently exposed portions of electrically conductive film 62 to a preferred height below an upper prominence 80 seen in FIG. 7 of sacrificial spacer 40. In this manner, out of electrically conductive film 62, a storage node 38 is formed peripheral to a contact plug 36. It can be seen that contact plug 36 stands higher than storage node 38, and that contact plug 36 is capped by the remnant of nitride layer 34 that has been formed into a nitride island 64 due to the dry etch that removed all exposed nitride layer 34 and portions of subsequently exposed electrically-conductive film 62.

Although contact plug 36 stands higher than storage node 38, the specific resistivity '$\Omega_1$, defined as electrical resistivity per unit cross-sectional area, is substantially the same in any portion of contact plug 36 as in any portion of storage node 38. Thus, the specific resistivity is substantially constant for storage node 38 at a point near the upper surface 86 of storage node 38 and proceeding downwardly through storage node 38 until contact region 84 seen in FIG. 7. Similarly, the specific resistivity of contact plug 36 is substantially constant at or immediately below the upper surface 88 of contact plug 36 progressing downwardly until contact region 84 seen in FIG. 7. Because both storage node 38 and contact node 36 have been formed from electrically-conductive film 62, the specific resistivity substantially anywhere within contact plug 36 is substantially similar to the specific resistivity anywhere within storage node 38. By substantially similar specific resistivities, it is meant by way of example that an absolute variance between a given measured resistivity at any two arbitrary points between contact plug 36 and storage node 38 or within contact plug 36 alone does not exceed about 10%, preferably it does not exceed about 2%, more preferably it does not exceed about 1%, and most preferably it does not exceed about 0.1%. The absolute variance is calculated between two specific resistivities '$\Omega_1$ and '$\Omega_2$ as $(('\Omega_1 - '\Omega_2)/'\Omega_1) \cdot 100$.

Besides the substantially similar specific resistivities between any two arbitrary points within contact plug 36, because electrically-conductive film 62 can be deposited under substantially uniform conditions, the grain density at any point within contact plug 36 and within storage node 38 will also be substantially similar. Thus, contact plug 36 will have substantially similar grain densities and specific resistivities at any two arbitrarily chosen points there within. In the prior art, substantially dissimilar specific resistivities and substantially dissimilar grain densities or grain sizes are observable at the seam between a composite made of a contact plug and a contact between the contact plug and the metallization.

Following formation of nitride island 64 and following an anisotropic dry etch that results in storage node 38 having a height less than contact plug 36, a subsequent etch is carried out to remove each sacrificial spacer 40 down to etch stop layer 58. In the case where second BPSG layer 60 is used, a wet oxide etch is preferred that stops on etch stop layer 58. Alternatively, any capped portion of any gate stack 14 may also include etch stop qualities that will cause etching of second BPSG layer 60 to be selective thereto.

Where the inventive method is used to form the peripheral structure from electrically-conductive film 62 into storage node 38, cell dielectric 42 is deposited substantially conformally upon the topology consisting of storage node 38, contact plug 36, and any structures therebetween. Cell plate layer 44 is formed upon cell dielectric 42.

Figure 9:
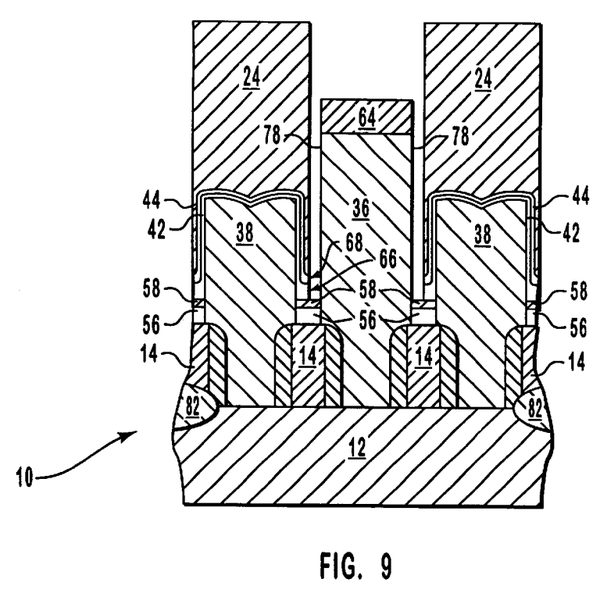
FIG. 9 is an elevational cross-section view of the semiconductor structure after further processing, wherein a masking layer has been formed over the topology of the semiconductor structure, and wherein an etch or a series of etches have been carried out in order to substantially remove the cell dielectric and the cell plate layers from the polysilicon structure in the middle and to substantially recede the cell plate layer from contact with the polysilicon structure in the middle.

After formation of cell dielectric 42 and cell plate layer 44, a second masking layer 24 is patterned in a manner to substantially expose nitride island 64 and a sidewall 78 of contact plug 36 as seen in FIG. 9. An anisotropic etch is carried out to remove exposed portions of cell plate layer 44 and cell dielectric 42. In a subsequent etch, or in the foregoing anisotropic etch, the etch chemistry may include isotropic qualities sufficient to etch portions of cell plate layer 44 and cell dielectric 42 away from sidewall 78 seen in FIG. 7 of contact plug 36 so as to prevent shorting of cell plate layer 44 with contact plug 36. In any event, the etch process achieves a cell dielectric edge 66 and a cell plate layer edge 68 that are sufficiently separated from sidewall 78 of contact plug 36 so as to prevent capacitative coupling and other undesirable electromagnetic characteristics. First BPSG layer 56 and etch stop layer 58 remain subsequent to the etch process.

Following etching to substantially isolate contact plug 36, second masking layer 24 is removed and dielectric layer 16, such as a rich BPSG chemistry, is deposited upon the exposed topology of semiconductor structure 10, including upon etch stop layer 58. A rich BPSG chemistry preferred in this embodiment comprises a boron concentration in the range from about five percent (5%) to about ten percent (10%), and a phosphorous concentration in a range from about three percent (3%) to about five percent (5%).

Figure 10:
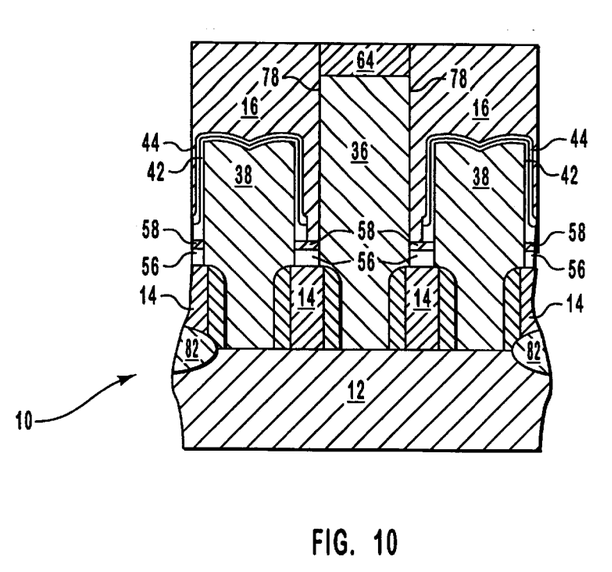
FIG. 10 is an elevational cross-section view of the semiconductor structure after further processing, wherein a dielectric film has been formed upon the topology of the semiconductor structure, wherein the dielectric film has been reflowed to substantially fill all regions between the middle and the peripheral electrically-conductive structures, and wherein the dielectric film has been etched back to be substantially planarized and to expose the sacrificial plug aligned with the electrically-conductive structure in the middle.

The rich BPSG chemistry of dielectric layer 16 will facilitate reflow of dielectric layer 16 into regions between storage node 38 and sidewall 78 of contact plug 36 as seen in FIG. 10. Although electrical insulation would be achievable by poor step coverage during deposition and attempted reflow of dielectric layer 16, wherein air is a suitable dielectric, reflow and filling into the region between contact plug 36 and sidewall 78 of contact plug 36 will add structural integrity that may be required in further processing. In FIG. 10 it can be seen that an upper surface has been formed that includes portions of dielectric layer 16 and nitride island 64. Substantially complete filling of dielectric layer 16 into the region between contact plug 36 and sidewall 78 of contact plug 36 will add structural integrity to semiconductor structure 10 that will assist in withstanding destructive mechanical forces during CMP or other handling. The upper surface of layers 16 and 64 may be formed by a planarizing process such as an etchback process or a CMP process that will stop on nitride island 64.

In this embodiment, contact plug 36 may stand higher than storage node 38 in a range from about 1,000 to 10,000 Angstroms, preferably from about 2,000 to about 8,000 Angstroms, and most preferably about 3,000 Angstroms.

Figure 11:
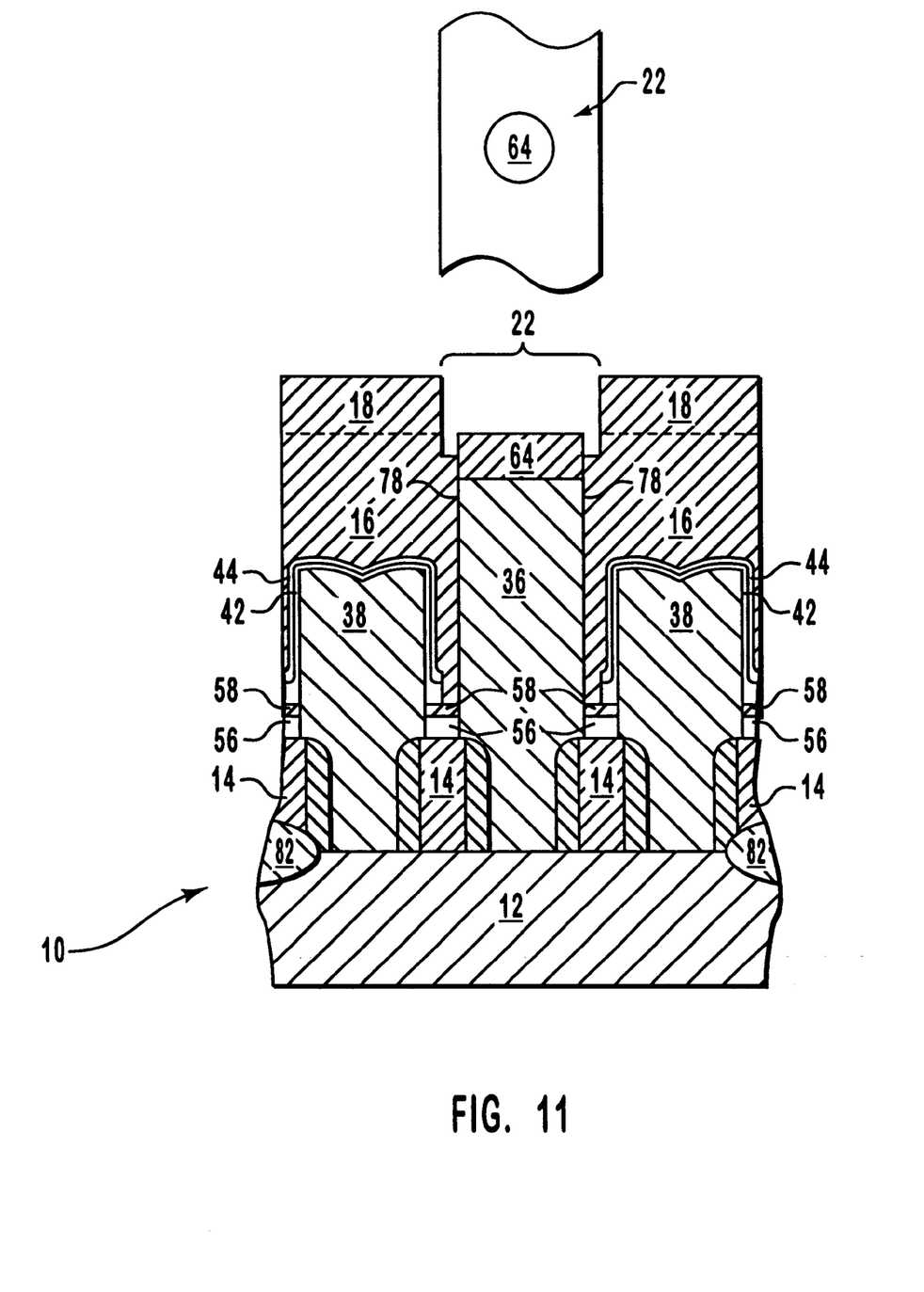
FIG. 11 is an elevational cross-section view of the semiconductor structure after further processing, wherein an interlayer dielectric film has been formed and patterned in alignment with the sacrificial plug.

FIG. 11 illustrates further processing of semiconductor structure 10 following formation of upper surface 70. Depending upon the overall height of dielectric layer 16 above contact plug 36, interlayer dielectric 18 may be formed to enhance the overall height. Interlayer dielectric 18 is illustrated as having been patterned in order to expose the upper surface of nitride island 64. Depending upon patterning photolithographic resolution and process tolerances, the width of first recess 22 may be greater than the width of nitride island 64. Patterning of interlayer dielectric 18 may be carried out, for example, with a wet etch that is selective to nitride island 64. Removal of nitride island 64 is next carried out in preferably a wet etch that is selective to polysilicon and BPSG according to the embodiment of the present invention. An aqueous hot phosphoric acid etch recipe is preferred.

Figure 12:
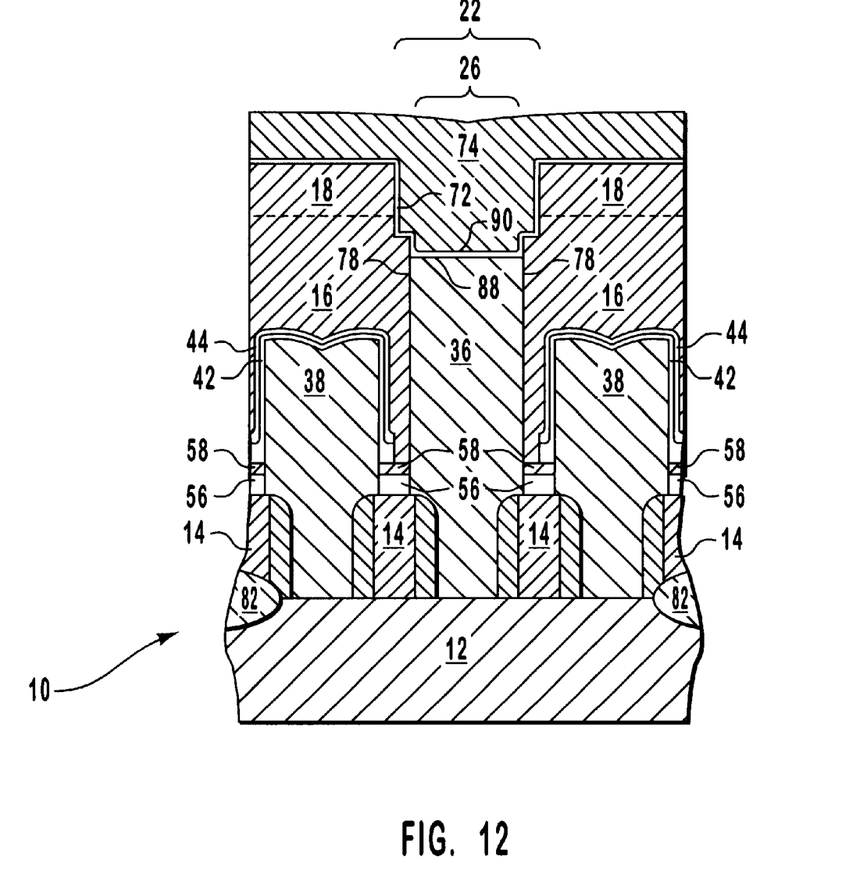
FIG. 12 is an elevational cross-section view of the semiconductor structure after further processing that includes removal of the sacrificial plug, wherein a barrier metallization has been formed over the topology of the semiconductor structure, wherein a metallization layer has been formed over the barrier metallization, and wherein the metallization has been substantially filled into the recess that forms a contact hole and alternatively additionally a trench.

FIG. 12 illustrates further processing of semiconductor structure 10. A barrier metallization 72 is illustrated as having been formed upon semiconductor structure 10 having a metallization layer 74 thereon. Barrier metallization 72 has qualities that will protect contact plug 36 while at the same time facilitate electrical connection between contact plug 36 and the ultimate metallization that will complete the formation of a contact. Barrier metallization 72 may include a titanium layer, followed by a titanium nitride layer. The titanium layer and the titanium nitride layer may be also formed with the titanium nitride layer being deposited first. Formation of the titanium nitride layer may also be carried out by first depositing a titanium layer, followed by thermal conversion of an exposed region of the titanium layer into titanium nitride in the presence of nitrogen gas. Where thermal conversion of the exposed region of the titanium layer into titanium nitride occurs, an upper surface 90 of barrier metallization 72 forms titanium nitride. Between upper surface 90 of barrier metallization 72 and upper surface 88 of contact plug 36 a qualitative structural gradient forms. Beginning at upper surface 90 of barrier metallization 72, titanium nitride forms. Between upper surface 90 of barrier metallization 72 and upper surface 88 of contact plug 36, an unreacted titanium layer may exist. Between the optionally existent unreacted titanium layer and upper surface 88 of contact plug 36, a titanium silicide layer is formed. Thus, proceeding downwardly from metallization layer 74 and into contact plug 36, there exists metallization layer 74, a titanium nitride layer, an optionally existent unreacted titanium layer, a titanium silicide layer, and the polysilicon in contact plug 36.

The formation of barrier metallization 72 may be carried out either by CVD or sputtering depending upon the specific application. Following formation of barrier 72, metallization layer 74 is formed upon semiconductor structure 10. Metallization layer 74 may include aluminum, tungsten, aluminum alloys, and the like.

Metallization layer 74 is substantially filled into first recess 22 and second recess 26 by force filling. Where metallization layer 74 is aluminum, force filling conditions preferably include a temperature in a range from about 450° C. to 520° C., a pressure in a range from about 700 atm to about 750 atm, and a processing time in a range from about 1 second to about 120 seconds.

Figure 13:
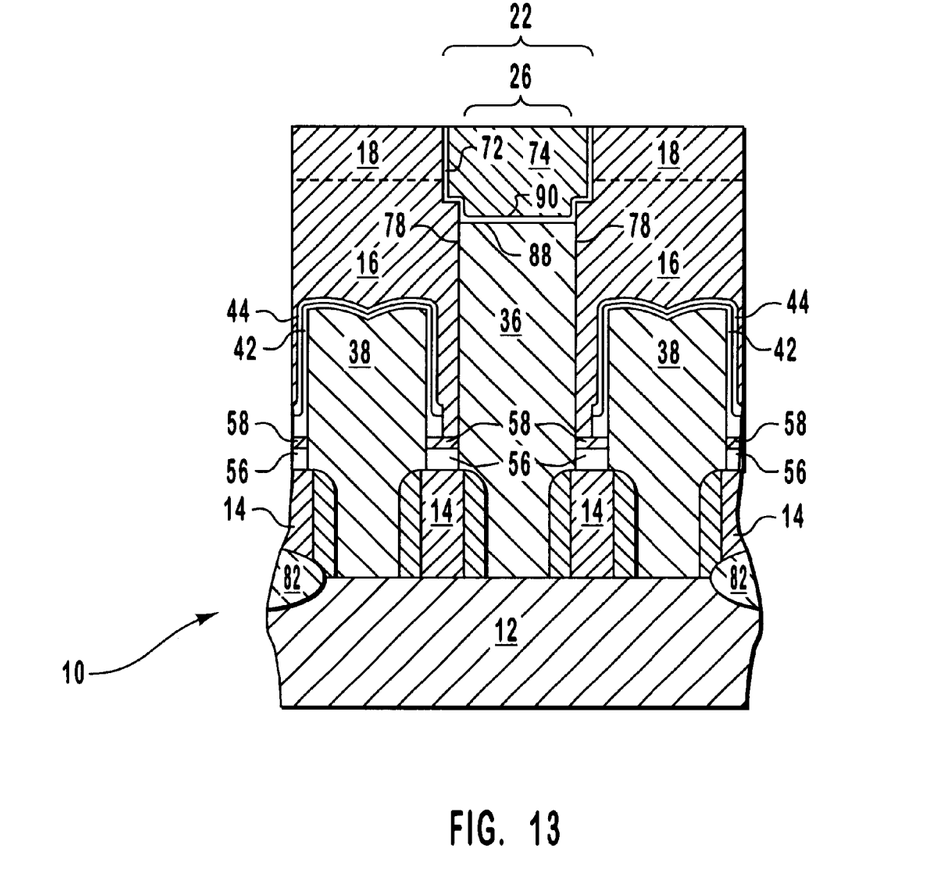
FIG. 13 is an elevational cross-section view of the semiconductor structure after further processing, wherein substantially all of the metallization layer above the level of the highest dielectric material has been substantially removed by etchback or by planarization.

FIG. 13 depicts further processing of semiconductor structure 10 after force filling of metallization layer 74 into first recess 22 and second recess 26. It can be seen that an upper surface of interlayer dielectric 18 has been formed that is substantially co-planar with portions of barrier metallization 72 and metallization layer 74. That portion of metallization layer 74 that is entirely within second recess 26 may comprise a filled contact hole. That portion of metallization layer 74 that is entirely within first recess 22 but not within second recess 26 may include a filled wiring trench. The upper surface of interlayer dielectric 18 may be formed by any preferred technique known in the art such as CMP.

The following examples are provided as illustrations of preferred embodiments of the present invention and are not intended to limit the scope or spirit of the invention thereby.

EXAMPLE 1

Referring to FIG. 7, semiconductor structure 10 comprises semiconductive substrate 12 with active areas (not shown) that form a portion of a transistor structure. A field oxide region 82 is illustrated as being a local oxidation of silicon (LOCOS) but any suitable isolating structure such as an isolation trench may be used. Upon gate stack 14 sacrificial spacer 40 comprises first BPSG layer 56, etch stop layer 58 that is formed by decomposition of a TEOS precursor, and second BPSG layer 60. Formation of sacrificial spacer 40 is formed by appropriate patterning and etching in order to open up contact region 84 upon semiconductive substrate 12. Sacrificial spacer 40 extends from gate stack 14 to a height in a range from about 1,000 to about 15,000 Angstroms, preferably from about 3,000 to 12,000 Angstroms, more preferably from about 5,000 to about 10,000 Angstroms, and most preferably about 9,000 Angstroms.

Following formation of sacrificial spacer 40, electrically-conductive film 62 is formed at a height standing upon contact region 84 of semiconductive substrate 12 in a range from about 3,000 Angstroms to about 10,000 Angstroms, and preferably from about 4,000 Angstroms to about 5,000 Angstroms. Formation of electrically-conductive film 62 is preferably carried out under conditions that do not substantially reveal the topology of sacrificial spacer 40 standing upon gate stack 14. A silane-based chemistry is preferably chosen to form electrically-conductive film 62 out of in situ doped polysilicon. Preferred CVD conditions include a pressure range from about 100 mTorr to about 2 Torr, and a temperature range from about 500° C. to about 600° C.

Formation of nitride layer 34 is formed either by CVD of $Si_3Ni_4$ or by thermal nitridation of upper portions of electrically-conductive film 62. Thermal nitridation of upper portions of electrically-conductive film 62 can be carried out to varying degrees of completion to form a silicon nitride. Silicon nitride, $Si_xN_y$, can be in the form where x=3 and y=4. However, $Si_xN_y$ can be in a preferred range where x=1, and wherein y=about 0.01 to about 2, preferably y=from about 0.1 to about 1.5, and most preferably y=about 1 to about 1.333.

First masking layer 20 is patterned to protect the structure in the middle of electrically-conductive film 62. In this example, first masking layer 20 is a photoresist. A dry etch is carried out to remove all of nitride layer 34 that is not protected by first masking layer 20. The same dry etch or a different etch is used to remove polysilicon of electrically-conductive film 62 to a level below upper prominence 80 of sacrificial spacer 40. In any event, the etch process is carried out to form contact plug 36 and storage node 38 as seen in FIG. 8. The etch conditions are controlled so as to strike a balance between a preferred height differential between contact plug 36 and storage node 38 and the attempt to maximize exposed surface area of storage node 38, as in this embodiment, storage node 38 forms part of a memory cell. The preferred dry etch chemistry at this stage of the process is a chlorine- or fluorine-based etch recipe. The selectivity ratio is chosen such that both silicon nitride and polysilicon are etched at rates substantially higher than that of the BPSG. The selectivity ratio that favors silicon nitride and polysilicon over BPSG is in an overall range from about 4:1, preferably about 8:1, and is more preferably about 10:1. Preferably, among the silicon nitride and the silicon, the selectivity favors the polysilicon such that the silicon nitride etches at a higher rate than the polysilicon. The preferred selectivity is not more than 2:1.

A subsequent wet etch is carried out to remove second BPSG layer 60 down to etch stop layer 58. In order to form storage node 38 into a completed memory cell, formation of cell dielectric 42 and cell plate layer 44 are carried out. Cell dielectric 42 is formed by deposition of silicon nitride, preferably Si$_3$N$_4$. Cell plate layer 44 is preferably an in situ doped CVD of polysilicon.

FIG. 9 illustrates further processing in the present example wherein second masking layer 24 is a photoresist and an anisotropic dry etch is first carried out to substantially remove exposed portions of cell plate layer 44 and cell dielectric 42. A chlorine- or fluorine-based etch chemistry is used. A second etch is carried out wherein an isotropic etching is used to etch cell plate layer 44 away from sidewall 78 of contact plug 36 in order to prevent shorting. The wet etch achieves cell dielectric edge 66 and cell plate edge 68. The wet etch can be configured with an etch recipe that can be substantially selective to storage node 36 over cell plate layer 44, although both structures may be substantially composed of polysilicon. Etch selectivity can be achieved by having a first doping concentration in contact plug 36 and a second doping concentration in cell plate layer 44.

Second masking layer 24 is stripped, and a rich BPSG layer is deposited to form dielectric layer 16. The rich BPSG layer includes about six percent (6%) boron and about three percent (3%) phosphorus. Dielectric layer 16 is reflowed to substantially fill the region between contact plug 36 and sidewall 78 of contact plug 36. Preferably, reflow conditions are a temperature in a range from about 950° C. to about 1050° C., and a reflow time in a range from about 20 seconds to about 30 seconds. Dielectric layer 16 is planarized down to nitride island 64 by a CMP process that is selective to nitride island 64 as illustrated in FIG. 10. Thereby, nitride island 64 acts as an etch stop.

FIG. 11 shows that a second BPSG layer, interlayer dielectric 18, has been deposited and patterned to expose upper surface 70 of nitride island 64. Patterning tolerance of interlayer dielectric 18 is illustrated as having first recess 22 being wider than nitride island 64. However, where pressure filling of metallization layer 74 is facilitated by a preferred chemistry and structure of barrier metallization 72, first recess 22 can be substantially the same width or narrower than nitride island 64.

Nitride island 64 is removed at this point in this example by a hot aqueous phosphoric acid etch. The etch recipe is preferably selective to BPSG and to polysilicon. A top view of first recess 22 and nitride island 64 is illustrated at the top of FIG. 1. It can be seen that first recess 22 is a trench and that nitride island 64 is a plug.

After removal of nitride island 64, barrier metallization 72 is formed by PVD or CVD of titanium and followed by PVD of tungsten nitride as illustrated in FIG. 12. The titanium in barrier metallization 72 has a thickness in a range from about 150 Angstroms to about 250 Angstroms. The titanium nitride in barrier metallization 72 has a thickness in a range from about 100 Angstroms to about 200 Angstroms. Metallization layer 74 is formed by CVD of aluminum.

Metallization layer 74 is forced-filled into first recess 22 and second recess 26. Barrier metallization 72 facilitates the flow of metallization layer 74 into first recess 22 and second recess 26. As illustrated in FIG. 12, metallization layer 74 is substantially filled into first recess 22 and second recess 26. The overall thickness of barrier metallization 72 has been chosen to substantially prevent metallization layer 74 from spiking into contact plug 36. In FIG. 13, metallization layer 74 has been substantially removed above the upper surface of interlayer dielectric 18 by CMP.

EXAMPLE 2

Example 2 is carried out under the same conditions as Example 1 with the exception that interlayer dielectric 18 is not deposited as illustrated in FIG. 11. Dielectric layer 16 is alternatively deposited and reflowed at a preferred height that is sufficient that interlayer dielectric 18 is not required. The preferred composition of dielectric layer 16 for the preferred height is about seven percent (7%) boron and about four percent (4%) phosphorus. Dielectric layer 16 substantially covers nitride island 64 at a height that is qualitatively illustrated by the height of interlayer dielectric 18 in FIG. 11. Patterning of dielectric layer 16 as illustrated analogously in FIG. 11 is carried out to expose the upper surface of nitride island 64.

EXAMPLE 3

In the third example, processing conditions are carried out as in Example 1 with the exception that interlayer dielectric 18 is not formed and dielectric layer 16 is deposited to a height above nitride island 64, but dielectric layer 16 is planarized to substantially achieve an upper surface that is co-planar with upper surface 70 of nitride island 64. In the embodiment of the third example, the interface illustrated in FIG. 11 between interlayer dielectric 18 and dielectric layer 16 comprises the exposed upper surface that includes upper surface 70. In Example 3, only first recess 22 exists such that after removal of nitride island 64, formation of barrier metallization layer 72, formation of metallization layer 74 as illustrated in FIG. 12, and planarization as illustrated in FIG. 13 achieves a contact that comprises contact plug 36, barrier metallization 72, and metallization layer 74. Substantially all of metallization layer 74 resides within second recess 26 and comprises trench metallization. In Example 3, the height of contact plug 36 is sufficient to substantially comprise all of the contact, and metallization layer 74 is a metal-filled trench making contact thereto.

EXAMPLE 4

In Example 4, the process according to Example 1 is carried out with the exception that an island 64 is substantially composed of undoped polysilicon. Etching of layer 34 and electrically-conductive film 62 according to the fourth example requires two etch chemistries. The first etch chemistry requires selectivity to doped polysilicon that comprises electrically-conductive film 62. The first etch chemistry substantially removes all exposed portions of layer 34 but leaves that portion of layer 34, which is undoped polysilicon, that resides within the etch shadow of first masking layer 20.

The second etch recipe is selective to undoped polysilicon and BPSG such that undoped polysilicon and BPSG etch more slowly than doped polysilicon. The second etch recipe achieves a structure substantially similar to that depicted in FIG. 8. Formation of cell dielectric 42 and cell plate layer 44 follow as illustrated in FIG. 8. In FIG. 9, the etch uses an etch recipe that is selective to the undoped polysilicon of island 64. An anisotropic etch is preferred in this embodiment such that contact plug 36, which comprises doped polysilicon, is substantially unetched in the anisotropic process. Following etching of cell plate layer 44 away from sidewall 78 by use of the anisotropic etch, formation of dielectric layer 16 is carried out.

Two alternatives are carried out in Example 4. In the first alternative, interlayer dielectric 18 is formed and patterned as analogously illustrated in FIG. 11. Island 64, which is substantially composed of undoped polysilicon, is removed with a wet etch that is selective to BPSG and doped polysilicon but is not selective to undoped polysilicon.

In the second alternative, dielectric layer 16 is formed of a height sufficient to cover island 64, which is substantially composed of undoped polysilicon. Dielectric layer 16 is patterned analogously to the patterning of interlayer dielectric 18, and removal of island 64 is carried out with an etch chemistry that is selective to BPSG and doped polysilicon but is not selective to undoped polysilicon.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A memory structure comprising:
   a contact plug extending to a top surface at a first height above a semiconductive substrate and making contact thereto;
   a barrier layer on the top surface of the contact plug, the barrier layer including a layer of titanium silicide and a layer of titanium nitride; and
   a storage node having a second height above said semiconductive substrate, wherein said second height is less than said first height, wherein the specific resistivity of the contact plug and the storage node is substantially the same, wherein the portion of the contact plug that extends above the storage node is wider than the portion of the contact plug that does not extend above the storage node.

2. A memory structure according to claim 1, wherein the portion of the contact plug that extends above the storage node has a first width and a second width, wherein the first width is wider than the second width.

3. A memory structure according to claim 2, wherein the portion of the contact plug having the first width is upon the portion of the contact plug having the second width.

4. A memory structure according to claim 1, wherein the layer of titanium nitride has a thickness in a range from about 100 Angstroms to about 200 Angstroms.

5. The memory structure according to claim 1, wherein the barrier layer also includes a layer of titanium between the layer of titanium nitride and the layer of titanium silicide.

6. A memory structure according to claim 5, wherein the layer of titanium has a thickness in a range from about 150 Angstroms to about 250 Angstroms.

7. An electrical device comprising:
   a pair of gate stacks situated upon a semiconductor substrate;
   a pair of capacitors each upon a respective one of said gate stacks;
   a contact plug having a width, projecting from an active area in the semiconductor substrate between the pair of gate stacks, and terminating above the capacitors at a trench, wherein the trench is defined in part by an electrically insulative material and has a width that is greater the width of the contact plug;
   an electrically conductive material within the trench, wherein the contact plug is separated from the electrically conductive material within the trench by a barrier layer, the barrier layer including a layer of titanium silicide and a layer of titanium nitride.

8. The electrical device as defined in claim 7, wherein the electrically conductive material has a top surface that is co-planar to a top surface of the electrically insulative material.

9. A electrical device according to claim 7, wherein the layer of titanium nitride has a thickness in a range from about 100 Angstroms to about 200 Angstroms.

10. A electrical device according to claim 7, wherein the barrier layer also includes a layer of titanium between the layer of titanium nitride and the layer of titanium silicide.

11. A electrical device according to claim 10, wherein the layer of titanium has a thickness in a range from about 150 Angstroms to about 250 Angstroms.

12. A electrical device according to claim 7, wherein each capacitor has a storage node that is composed of the same material that the contact plug is composed of.

13. A contact structure comprising:
   a pair of gate stacks situated upon a semiconductor substrate;
   a pair of capacitors each upon a respective one of said gate stacks, each capacitor having a storage node that is composed of polysilicon;
   a contact plug:
      composed of polysilicon;
      having a width;
      projecting from an active area in the semiconductor substrate between the pair of gate stacks; and
      terminating above the capacitors at a trench, wherein the trench is defined in part by an electrically insulative material and has a width that is greater the width of the contact plug;
   a barrier layer within the trench and upon the contact plug, the barrier layer including a layer of titanium silicide and a layer of titanium nitride;
   an electrically conductive material on the barrier layer within the trench and being selected from the group consisting of aluminum, tungsten, and an alloy of aluminum.

14. A electrical device according to claim 13, wherein the layer of titanium nitride has a thickness in a range from about 100 Angstroms to about 200 Angstroms.

15. A electrical device according to claim 13, wherein the barrier layer also includes a layer of titanium between the layer of titanium nitride and the layer of titanium silicide.

16. A electrical device according to claim 15, wherein the layer of titanium has a thickness in a range from about 150 Angstroms to about 250 Angstroms.

17. The contact structure as defined in claim 13, wherein the electrically conductive material has a top surface that is co-planar with a top surface of the electrically insulative material.

* * * * *

UNITED STATES PATENT AND TRADEMARK OFFICE
CERTIFICATE OF CORRECTION

PATENT NO.   : 6,229,174 B1                                   Page 1 of 1
DATED        : May 8, 2001
INVENTOR(S)  : Kunal R. Parekh It is certified that error appears in the above-identified patent and that said Letters Patent is hereby corrected as shown below:

Column 2,
Line 48, after "layer 16" change "but" to -- and --
Line 67, before "also" delete [that]

Column 6,
Line 45, after "In" change "FIG. 7 is" to -- FIG. 7, it --
Line 47, after "spacer 40" delete [,]

Column 7,
Line 17, after "all" insert -- of --

Column 8,
Line 14, after "FIG." change "7" to -- 9 --

Column 12,
Line 15, after "with the" change "exception" to -- exceptions --

Column 14,
Line 36, after "greater" insert -- than --

Signed and Sealed this

Twelfth Day of March, 2002

Attest:

Attesting Officer

JAMES E. ROGAN
Director of the United States Patent and Trademark Office